United States Patent
Lee et al.

(10) Patent No.: US 10,818,503 B2
(45) Date of Patent: Oct. 27, 2020

(54) METHOD OF ETCHING AT LOW TEMPERATURE AND PLASMA ETCHING APPARATUS

(71) Applicant: SAMSUNG ELECTRONICS CO., LTD, Suwon-si, Gyeonggi-do (KR)

(72) Inventors: Cheonkyu Lee, Hwaseong-si (KR); Moonseok Kim, Suwon-si (KR); Iksu Byun, Hwaseong-si (KR); Changwoo Song, Uijeongbu-si (KR); Seongha Jeong, Hwaseong-si (KR); Dongseok Han, Daegu (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/260,816

(22) Filed: Jan. 29, 2019

(65) Prior Publication Data
US 2019/0385860 A1    Dec. 19, 2019

(30) Foreign Application Priority Data
Jun. 15, 2018  (KR) ........................ 10-2018-0069208

(51) Int. Cl.
H01L 21/3065    (2006.01)
H01J 37/32      (2006.01)
H01L 21/311     (2006.01)

(52) U.S. Cl.
CPC .... *H01L 21/3065* (2013.01); *H01J 37/32449* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 5,515,986 | A * | 5/1996 | Turlot | C23C 16/5096 216/71 |
| 6,235,640 | B1 * | 5/2001 | Ebel | H01L 21/02063 257/E21.257 |
| 8,801,952 | B1 * | 8/2014 | Wang | B44C 1/22 216/73 |
| 2003/0192858 | A1 | 10/2003 | Donohoe et al. | |
| 2010/0248490 | A1 * | 9/2010 | McMillin | H01J 37/32788 438/716 |
| 2011/0065276 | A1 * | 3/2011 | Ganguly | H01L 21/0223 438/694 |
| 2012/0196447 | A1 * | 8/2012 | Yang | H01L 21/31116 438/734 |
| 2013/0109190 | A1 | 5/2013 | Lill et al. | |
| 2015/0079799 | A1 * | 3/2015 | Nemani | H01L 21/76807 438/714 |
| 2015/0214101 | A1 * | 7/2015 | Ren | H01L 21/3065 438/704 |
| 2015/0228497 | A1 * | 8/2015 | De Schepper | H01L 21/3086 438/694 |
| 2016/0189975 | A1 | 6/2016 | Takeda et al. | |
| 2016/0314986 | A1 * | 10/2016 | Tominaga | H01L 21/31116 |

(Continued)

*Primary Examiner* — Allan W. Olsen
(74) *Attorney, Agent, or Firm* — F. Chau & Associates, LLC

(57) ABSTRACT

A method of etching at a low temperature includes cooling a pedestal on which a wafer is disposed, etching the wafer by generating plasma from a gas supplied through a gas distribution unit, and injecting a heated inert gas into the chamber through the gas distribution unit.

16 Claims, 8 Drawing Sheets

(56) References Cited

U.S. PATENT DOCUMENTS

2017/0029948 A1* 2/2017 Jongbloed ............... C23C 16/52
2017/0117118 A1* 4/2017 Toh ..................... H01J 37/3244
2019/0027373 A1* 1/2019 Kwon ............... H01L 21/02164

* cited by examiner

US 10,818,503 B2

METHOD OF ETCHING AT LOW TEMPERATURE AND PLASMA ETCHING APPARATUS

CROSS-REFERENCE TO RELATED APPLICATION

This application claims priority under 35 U.S.C. § 119 to Korean Patent Application No. 10-2018-0069208, filed on Jun. 15, 2018, in the Korean Intellectual Property Office, the disclosure of which is incorporated by reference herein in its entirety.

TECHNICAL FIELD

The present inventive concept relates to a method of etching at a low temperature and a plasma etching apparatus used therein.

DISCUSSION OF RELATED ART

In general, a semiconductor device is manufactured through a plurality of unit processes which include a deposition process and an etching process of a thin film, and the etching process is mainly performed using a plasma etching apparatus to carry out a plasma etching reaction.

Recently, the plasma etching process may be performed at a low temperature to form a structure having a high aspect ratio, or to secure a high selectivity when a wafer is etched using a photoresist film as an etch mask. When the wafer is exposed to a room temperature environment after the plasma etching at the low temperature, foreign substances and/or moisture may be adsorbed on the surface of the wafer to contaminate or cause defects on the wafer due to a cold trap effect.

SUMMARY

An aspect of the present inventive concept provides a method of etching at a low temperature and a plasma etching apparatus used therein, and the method is capable of rapidly raising a temperature of an object (for example, a wafer) after etching.

According to an aspect of the present inventive concept, a method of etching at a low temperature includes cooling a pedestal on which a wafer is disposed in a chamber, etching the wafer by generating plasma from a gas supplied through a gas distribution unit, and injecting a heated inert gas into the chamber through the gas distribution unit.

According to an aspect of the present inventive concept, a method of etching at a low temperature includes disposing a wafer on a pedestal in a chamber, cooling the pedestal to about −100° C. or lower using a chiller (i.e., cryogenic chiller), etching the wafer by generating plasma from a gas supplied through a gas distribution unit, raising the etched wafer to be spaced apart from the pedestal, and injecting a heated inert gas into the chamber through the gas distribution unit.

According to an aspect of the present inventive concept, a plasma etching apparatus includes a pedestal having an electrostatic chuck for holding a wafer and provided with a coolant passage, a gas distribution unit provided with a nozzle toward the pedestal, a chiller supplying a coolant to the coolant passage for cooling the pedestal, a first gas supply source supplying a fluorine-containing gas through the gas distribution unit, a power supply unit for generating plasma from the supplied fluorine-containing gas, and a second gas supply source supplying a heated inert gas through the gas distribution unit.

BRIEF DESCRIPTION OF THE DRAWINGS

The above and other aspects and features of the present disclosure will be more clearly understood from the following detailed description, taken in conjunction with the accompanying drawings, in which.

Figure 1:
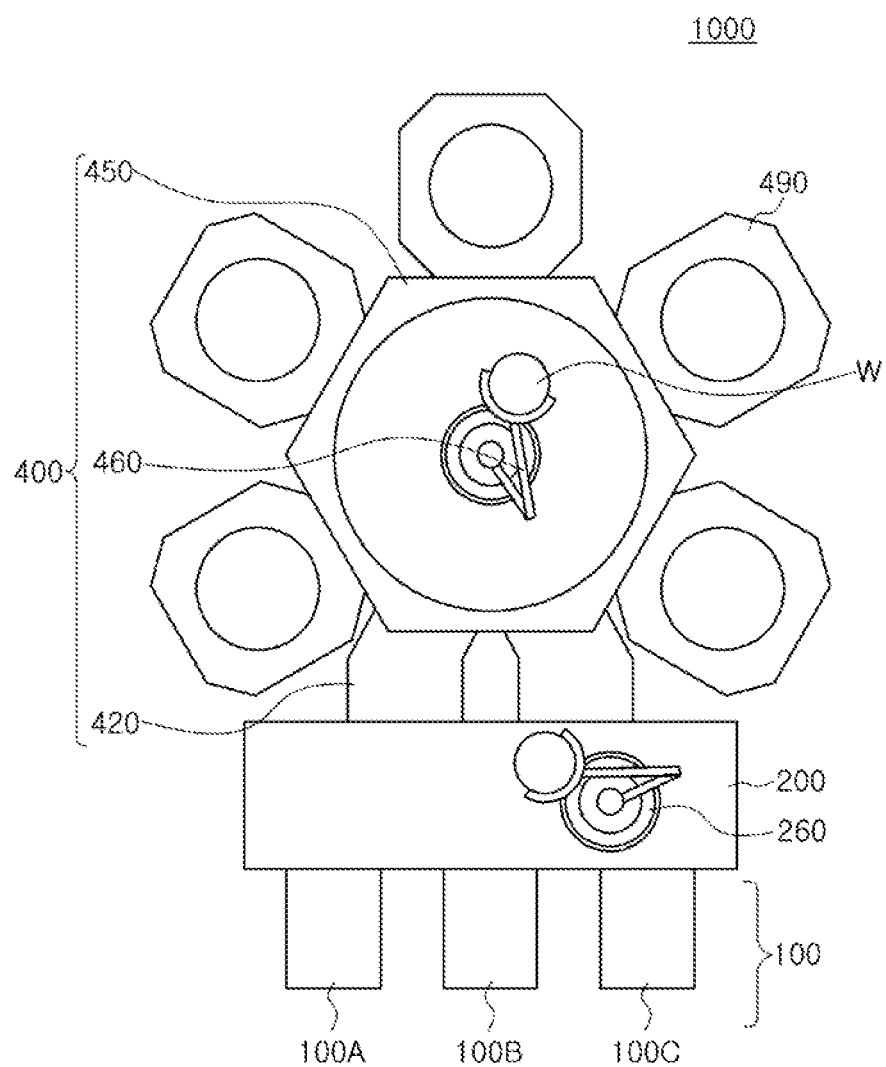
FIG. 1 is a schematic diagram illustrating a plasma etching system according to an example embodiment of the present inventive concept.

Since the drawings in FIGS. 1-10 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, example embodiments of the present inventive concept will be described with reference to the accompanying drawings.

FIG. 1 is a schematic diagram illustrating a plasma etching system according to an example embodiment of the present inventive concept.

Figure 2:
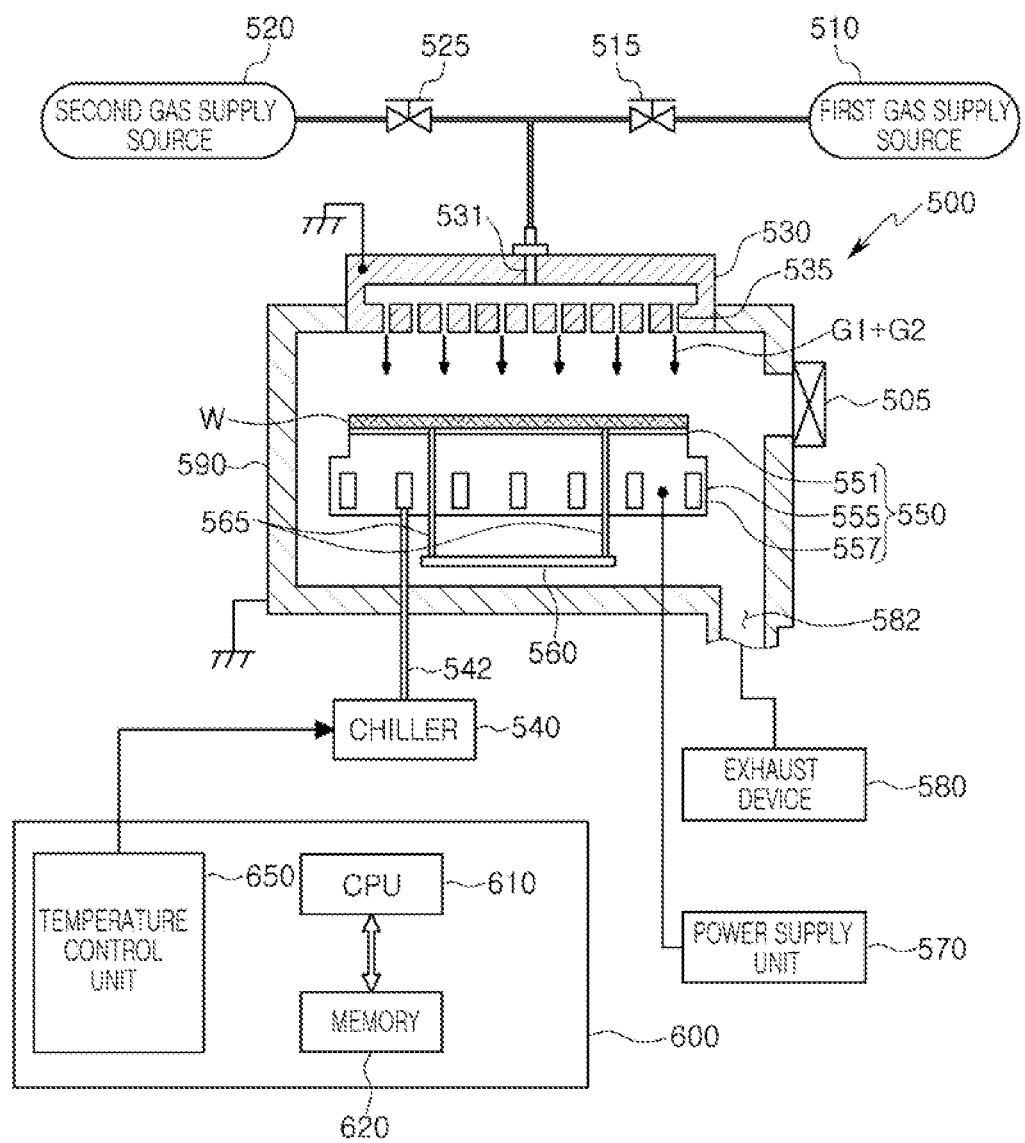
FIG. 2 is a longitudinal cross-sectional view illustrating a plasma etching apparatus (during an etching process) according to an example embodiment of the present inventive concept.

Referring to FIG. 1, a plasma etching system 1000 according to the present example embodiment may include a loading port 100, a transfer module 200, a process module 400, and a control unit 600 (shown in FIG. 2).

The loading port 100 may include a plurality of ports 100A, 100B, and 100C each respectively having a container in which a plurality of wafers are stored. The process module 400 may include a load lock chamber 420, a transfer chamber 450, and a process chamber 490. The process module 400 may include one or more process chambers 490. Five process chambers 490 are shown in FIG. 1 as an example, but the present inventive concept is not limited thereto.

Figure 3:
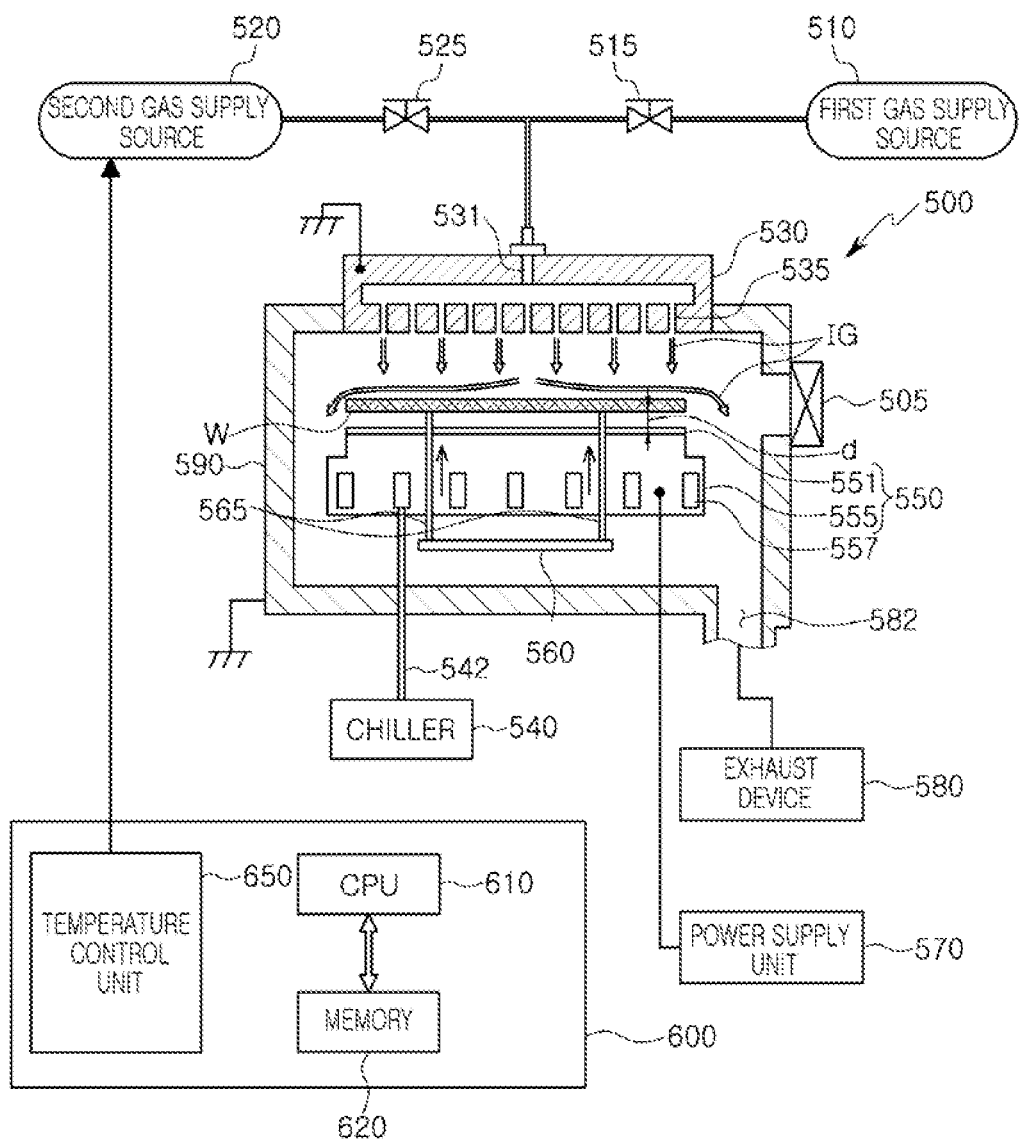
FIG. 3 is a longitudinal cross-sectional view illustrating a plasma etching apparatus (during a heating process) according to an example embodiment of the present inventive concept.

Some or all of the process chambers 490 employed in the present example embodiment may be chambers for plasma etching, for example, at least one of the process chambers 490 may correspond to a chamber 590 included in a plasma etching apparatus 500 illustrated in FIGS. 2 and 3. As required, another portion of the process chambers 490 may include a chamber for performing other treatment processes such as cleaning or deposition.

The transfer module 200 may be configured to transfer the wafer W between the loading port 100 and the process module 400. The transfer module 200 may have an inner space separated from an outer space, and may include a transfer robot 260 for transferring the wafer to the inner space. The transfer robot 260 in the transfer module 200 may include an arm which may move in horizontal and vertical directions, and a rotary plate to which the arm is fixed and is rotatable. The transfer robot 260 in the transfer module 200 may remove the wafer W from a container of the loading port 100 and transfer the wafer to the process module 400 or may remove the wafer from the process module 400 and transfer the wafer W to a container of the loading port 100.

A transfer of the wafer W from the transfer module 200 to the transfer chamber 450 is performed through the load lock chamber 420 disposed between the transfer chamber 450 and the transfer module 200. The load lock chamber 420 is configured to depressurize or pressurize the inner space to or from a vacuum state. One load lock chamber 420 is shown in FIG. 1 as an example, but the present inventive concept is not limited thereto. For example, the plasma etching system 1000 may include two or more load lock chambers 420 for transferring the wafer W into and out from the transfer chamber 450. The transfer chamber 450 may have an inner space connectable to the load lock chamber 420 and the process chamber 490, and may include the transfer robot 460 configured to transfer the wafer W in the inner space. One transfer chamber 450 is shown in FIG. 1 as an example, but the present inventive concept is not limited thereto. For example, the plasma etching system 1000 may include two or more transfer chambers 450 each for transferring the wafer W between one load lock chamber 420 and one process chamber 490 or between two process chambers 490. The transfer chamber 450 may be maintained at high vacuum condition, or any other suitable pressure condition for transferring the wafer W within the plasma etching system 1000.

A plasma etching may be performed at a low temperature or an ultra-low temperature (for example, about −100° C. or less) in the process chamber 490 employed in the present example embodiment. The temperature of the wafer W is significantly lowered after the plasma etching at the low temperature. Therefore, when the wafer W is unloaded without heating, moisture or foreign substances in the surroundings are adsorbed on the wafer W in the ultra-low temperature state due to a principle of cold trap effect such that the wafer W may be contaminated or cause defects. Here, the cold trap effect indicates that moisture and/or foreign substances in the surrounding air are adsorbed through a low-temperature condensation on the surface of the wafer W. For example, in the process of transferring a plasma etched wafer W at a low temperature from the process chamber 490 to the transfer chamber 450, or transferring the wafer W to the load lock chamber 420 for taking out to the outside, serious contamination may occur.

To prevent the contamination of the wafer W due to the cold trap effect, the present inventive concept provides a method of injecting a heated inert gas using a gas distribution system into a etching process chamber (for example, in situ) to rapidly raise the temperature of the wafer W after the plasma etching at the low temperature.

Hereinafter, a plasma etching method at a low temperature according to an example embodiment of the present inventive concept will be described in detail with reference to FIGS. 2 and 3.

FIGS. 2 and 3 are longitudinal cross-sectional views illustrating a plasma etching apparatus 500 according to an example embodiment of the present inventive concept, and in particular, illustrating internal operating states of the process chamber 590 included in the plasma etching apparatus 500 during the plasma etching process at the low temperature and the heating process, respectively. The plasma etching apparatus 500 illustrated in FIGS. 2 and 3 may be understood as a portion corresponding to the process chamber 490 of the plasma etching system 1000 illustrated in FIG. 1.

Referring to FIGS. 2 and 3, the plasma etching apparatus 500 according to an example embodiment of the present inventive concept includes a chamber 590, a gas distribution unit 530 disposed to face the inside portion of the chamber 590, and a pedestal 550 disposed in the chamber 590.

The plasma etching apparatus 500 may be a capacitively coupled plasma etching apparatus. For example, the plasma etching apparatus 500 may be a multi-frequency capacitively coupled plasma etching apparatus. The plasma etching apparatus 500 may be a single, double, triple, or more frequencies capacitively coupled plasma etching apparatus with each of the frequencies at a frequency of from about 100 kHz to about 80 MHz.

The chamber 590 may provide a closed space for performing a plasma etching process. The chamber 590 may be provided in various forms depending on shape, size of the substrate, and the like. The chamber 590 may include at least one of a metal and an insulator.

A pedestal 550 is disposed in a lower portion of the chamber 590 and is used as a support for holding a wafer W in an etching process. The chamber 590 is preferably a single-wafer chamber, but may be configured for batch operation. The pedestal 550 may include a support 555 and an electrostatic chuck 551 disposed on an upper surface of the support 555. The electrostatic chuck 551 may be configured to electrostatically absorb the wafer W using coulomb force. For example, the electrostatic chuck 551 may include a ceramic layer with electrodes interposed therebetween. The support 555 may include a metal.

The pedestal 550 employed in the present example embodiment may include a lift assembly 560 in which a lifting pin 565 is provided. The lifting pin 565 may be configured to penetrate the pedestal 550 and may lift the wafer W disposed on the pedestal 550 or lower the wafer to be in contact with the electrostatic chuck 551.

A coolant passage 557 is formed in the support 555 employed in the present example embodiment. The coolant passage 557 may be configured to circulate the coolant within the support 555 through a pipe 542 connected to a chiller (i.e., cryogenic chiller) 540. Through the circulation of the coolant, the wafer W disposed on the pedestal 550 may be cooled to a desired temperature. For example, the pedestal 550 may have the electrostatic chuck 551 for holding the wafer W, and may be provided with the coolant passage 557 into which the chiller 540 may supply the coolant for cooling the pedestal 550, and thereby cooling the wafer to a low temperature or an ultra-low temperature (for example, about −100° C. or less).

In the plasma etching apparatus 500, the gas distribution unit 530 and the pedestal 550 may be used as an upper electrode and a lower electrode, respectively. A power supply unit 570 for supplying power is connected to the pedestal 550. The power supply unit 570 provides high-frequency power for generating plasma. The chamber 590 may provide a closed plasma-forming space between the upper electrode and the lower electrode for performing the plasma etching process. For example, the power supply unit 570 may provide a voltage differential between the upper electrode and the lower electrode, the voltage differential may create an electromagnetic field in the closed plasma-forming space, and an etching gas between the closed plasma-forming space may then be ionized to form plasma.

The gas distribution unit 530, which is mounted on an upper portion of the chamber 590 as illustrated in FIG. 2, may be grounded. However, the present inventive concept is not limited thereto. For example, in an example embodiment of the present inventive concept, the gas distribution unit 530 may be connected to a direct current (DC) power source such that a constant DC voltage is applied.

The gas distribution unit 530 includes a gas injection port 531 connected to pipes of a first gas supply source 510 and a second gas supply source 520, and the gas supplied from the gas injection port 531 may be sprayed toward the wafer W placed on the pedestal 550 through a plurality of spraying holes 535. The flow rates of the first and second gas supply sources 510 and 520 may be controlled through valves 515 and 525, respectively, operated by a control unit 600. Alternatively, the gas distribution unit 530 may include a nozzle or a plurality of nozzles for spraying the gas supplied from the first gas supply source 510 or the second gas supply source 520 toward the wafer W placed on the pedestal 550.

The first gas supply source 510 may be provided to supply gas for generating plasma. The first gas supply source 510 may supply a fluorine-containing gas. For example, the fluorine-containing gas may include at least one selected from, for example, carbon tetrafluoride ($CF_4$), hexafluorobutadiene ($C_4F_6$), octafluorocyclobutane ($C_4F_8$), trifluoromethane ($CHF_3$) and sulfur hexafluoride ($SF_6$). In particular, in a plasma etching process at a low temperature, fluorine-rich gases such as $CF_4$ and $SF_6$ may be used. This will be described in detail with reference to FIG. 4.

The second gas supply source 520 employed in the present example embodiment may include an inert gas. The inert gas may be provided as a heating gas for heating the cooled wafer W. The temperature of the inert gas may range from about 50° C. to about 100° C. as a criterion measured by the gas distribution unit 530. For example, the inert gas may include at least one selected from, for example, helium (He), neon (Ne), argon (Ar), krypton (Kr) and xenon (Xe). The heated inert gas may also be able to provide a clean environment without moisture and containments for the cooled wafer W besides having the capability of heating the cooled wafer W.

An exhaust port 582 is formed in a bottom surface of the chamber 590. An interior of the chamber 590 may be exhausted through the exhaust port 582 by an exhaust device 580, and the interior of the chamber 590 may be depressurized to maintain at a desired degree of vacuum. For example, the exhaust device 580 may include a vacuum pump (e.g., a rotary pump, a turbo molecular pump or the like) to evacuate the interior of the chamber 590 to a predetermined vacuum level. On a side wall of the chamber 590, a gate 505 configured to open and close an inner space of the chamber 590 is provided. The gate 505 may be connected to the inner space of the chamber 590 and the transfer chamber 450 illustrated in FIG. 1. The wafer W may be carried into or out of the chamber 590 through the gate 505.

The plasma etching apparatus 500 may include a control unit 600 controlling an entire operation. The control unit 600 may include a CPU 610, a memory 620 such as a read-only memory (ROM) and/or a random-access memory (RAM), and a temperature control unit 650. In particular, the temperature control unit 650 may be configured to control the temperature for the plasma etching at the low temperature and the temperature of the inert gas for heating the wafer W, by connecting to the chiller 540 and the second gas supply source 520, respectively. The CPU 610 may execute a desired process such as the plasma etching at the low temperature, or the wafer heating process according to various recipes stored in the memory 620. The recipes stored in the memory 620 may include information such as process time, pressure, high frequency power or voltage, the flow rate of the supply gas, a temperature of the chamber 590, a temperature of the chiller 540, a temperature of the second gas supply source 520, or the like.

As illustrated in FIG. 2, the wafer W disposed on the pedestal 550 is adsorbed to the electrostatic chuck 551 by the coulomb force and maintains adsorbed. Then, the plasma etching process at the low temperature may be performed on the wafer W by generating plasma for etching with the pedestal 550 being cooled by the chiller 540.

Gas (G1+G2) for generating plasma may be injected into the gas distribution unit 530 from the first gas supply source 510, sprayed into the chamber 590 through the gas distribution unit 530, and high-frequency power may be supplied to the chamber 590, and accordingly, plasma may be generated from the gas (G1+G2) between the gas distribution unit 530 and the pedestal 550 within the chamber 590. The plasma etching process may be performed on the wafer W adsorbed to the electrostatic chuck 551 by the generated plasma. The gas for generating plasma may include, but is not limited to: a fluorine-containing gas G1 and a hydrogen-containing gas G2 such as $H_2$.

The plasma etching process may be performed as a cryogenic etching process. The cryogenic etching process may be used to form a fine semiconductor structure with a high aspect ratio, by not only ensuring a high selectivity in etching a wafer using a patterned photoresist as an etch mask but also operating the etching gas simultaneously with a passivation gas.

Figure 4:
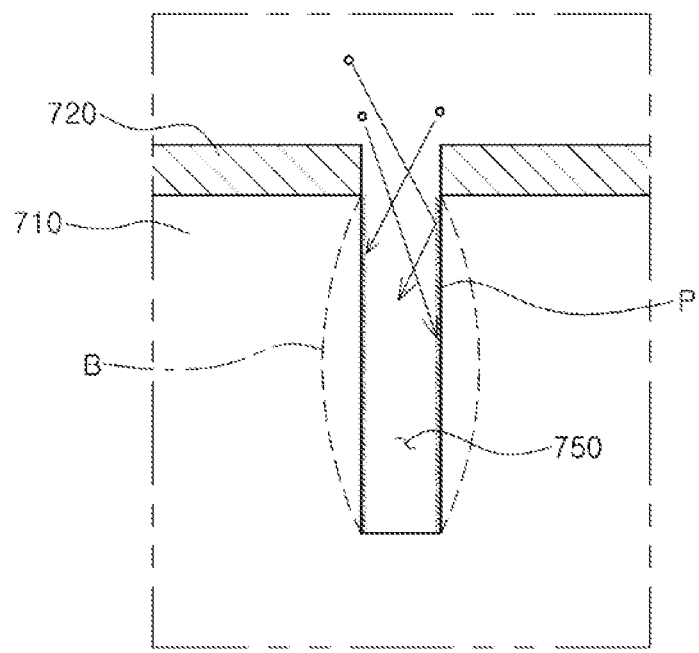
FIG. 4 is a schematic diagram illustrating a cross-section of a semiconductor layer covered by photoresist during an etching process at a low temperature according to an example embodiment of the present inventive concept.

FIG. 4 illustrates a process of forming a fine pattern having a high aspect ratio in a semiconductor layer using photoresist as an etch mask. The semiconductor layer may be a silicon layer, but the present inventive concept is not limited thereto.

At a low temperature (for example, about −100° C. or less), a high etch selectivity may be ensured, such that the thickness of the photoresist may be kept thin and a photolithography process using an extreme ultra violet (EUV) may be stably introduced. For example, when the cryogenic etching process is carried out in etching a silicon layer, the silicon layer etch rate increases and the photoresist etch rate decreases when the process temperature is reduced, especially to about −100° C. or less. Thus, a high etch selectivity of the silicon layer with respect to the photoresist may be ensued in the plasma etching process, and a fine pattern having a high aspect ratio in the silicon layer may be achieved when the process temperature is dropped to about −100° C. or less.

To form a finer pattern in the photolithography process, the EUV, shorter in wavelength than the existing ArF, may be used as an exposure light source. However, when the EUV is used as the exposure light source, to use a photoresist 720 (as shown in FIG. 4) having a thinner thickness than before may be required. However, in the plasma etching process using the thin photoresist 720 as an etch mask, the etching rate of a semiconductor layer 710 should be significantly higher than the etching rate of the photoresist 720. In other words, a sufficiently high etch selectivity is required. The high etch selectivity may be ensured by performing the plasma etching process at the low temperature (for example, about −100° C. or less).

When forming a structure such as a trench 750 having a high aspect ratio, an undesired profile may be generated in the plasma etching process. For example, as illustrated by a dotted line in FIG. 4, the trench 750 having a high aspect ratio tends to have a bowing shape B. To prevent this, a passivation film P for protecting the etched side wall may be formed by supplying a passivation gas separately from the etching gas. However, when a fluorine-rich gas such as $CF_4$ and/or $SF_6$ is supplied to the plasma etching gas as in the present exemplary embodiment, the etching gas may also operate with the passivation gas at a low temperature of about −100° C. or less. In other words, as illustrated in FIG. 4, $CF_4$ and/or $SF_6$ may be performed as a passivation gas with the etching gas at an ultra-low temperature, and the passivation film P may be formed on an inner wall of the trench 750, thereby easily making the profile better in the same structure as the trench 750 having the desired high aspect ratio.

As illustrated in FIG. 3, a process of heating the wafer W is performed after the plasma etching process. After the plasma etching process at the low-temperature, the plasma and the reactant may be discharged from the chamber 590 through the exhaust port 582 in the bottom surface of the chamber 590 to the outside by the exhaust device 580.

The wafer W etched in an environment at a temperature of about −100° C. or less is maintained at a significantly low temperature, a comparable low temperature thereof.

The temperature of the wafer W is raised to a level of a room temperature within a short time in the chamber 590 to prevent the cooled wafer W from being contaminated due to the cold trap effect in the subsequent process. For example, moisture and/or foreign substances in the surrounding air, to which the wafer W is exposed, may be prevented from being condensed on the surface of the wafer W which is now heated to the room temperature. In the present example embodiment, the heated inert gas IG is used as the heating means.

The inert gas IG may be supplied to the chamber 590 through the gas distribution unit 530 from the second gas supply source 520 which supplies the inert gas. For example, the inert gas IG may be at least one inert gas selected from, for example, He, Ne, Ar, Kr and Xe. For example, He or Ar may be used.

The inert gas IG supplied from the second gas supply source 520 may be heated to a desired level of temperature by a temperature control unit 650. For example, the temperature of the heated inert gas IG may range from about 50° C. to about 100° C. The temperature may be understood as the temperature measured at the gas distribution unit 530, although there is a slight difference depending on the measurement position.

The heated inert gas IG may be sprayed onto the wafer W through the gas distribution unit 530 to heat the wafer W in a direct contact manner. For example, the heated inert gas IG at the temperature range from about 50° C. to about 100° C. supplied from the second gas supply source 520 may be sprayed through a plurality of spraying holes 535, or through a nozzle or a plurality of nozzles, of the gas distribution unit 530 toward the wafer W placed on the pedestal 550. In this process, the wafer W may be heated to a desired level of room temperature (from about 10° C. to about 30° C.). Depending on the temperature and the flow rate of the inert gas IG, the process of raising the temperature may be performed for about 10 seconds to about 1 minute.

In the present example embodiment, as illustrated in FIG. 3, the wafer W may be raised to be spaced apart from the pedestal 550, and the heating process using the above-described inert gas IG may be performed in the state in which the wafer W is raised. The raised wafer W may be separated from the pedestal 550 which is still at low temperature, and allowed the heated inert gas IG to heat the raised wafer W from front and back sides (i.e., upper surface and lower surface).

The process of raising the wafer W may be performed by applying a direct current DC voltage opposite to that at the time of adsorption of the wafer W to the electrostatic chuck 551 to discharge the charge of the wafer W (also referred as a dechuck) after the plasma etching process at the low temperature, and lifting the wafer W using the lifting pin 565. As such, since the wafer W is heated over substantially the entire surface, for example, including front and back sides of the wafer W, the overall area of the wafer W may be rapidly heated to a desired room temperature, and a uniform temperature rise may be expected.

Figure 5:
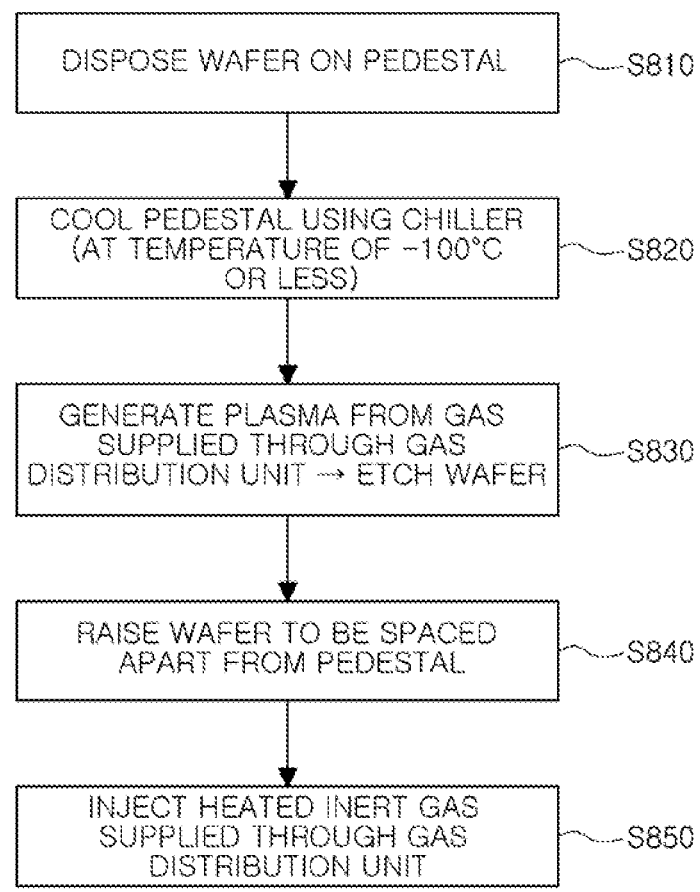
FIG. 5 is a flow chart of a process illustrating an etching method at a low temperature according to an example embodiment of the present inventive concept.

FIG. 5 is a process flow chart illustrating an etching method at a low temperature according to an example embodiment of the present inventive concept, and FIGS. 6 to 9 are longitudinal cross-sectional views illustrating the operation of a plasma etching apparatus performing key processes of the etching method at a low temperature, respectively, according to an example embodiment of the present inventive concept.

Figure 6:
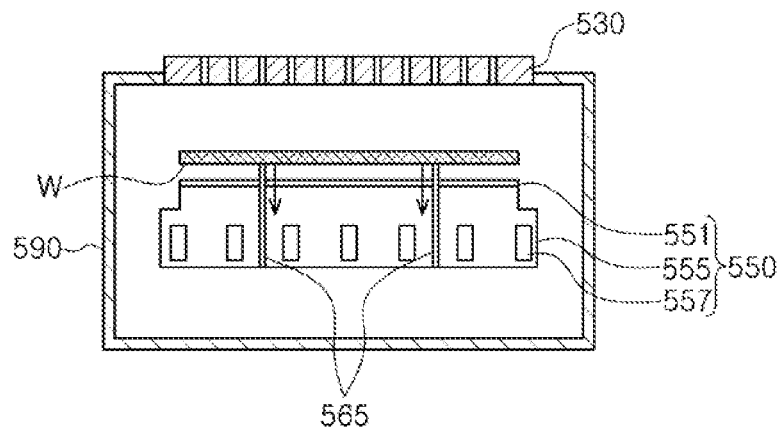
FIGS. 6 to 9 are longitudinal cross-sectional views illustrating operating states of a plasma etching apparatus performing key processes of an etching method at a low temperature, respectively, according to an example embodiment of the present inventive concept.

First, referring to FIGS. 5 and 6, the present etching method at the low temperature may start with a step (S810) of disposing a wafer W on the pedestal 550 in the chamber 590.

The wafer W may be transferred from the transfer chamber (450 of FIG. 1) into the chamber 590 of the plasma etching apparatus, and the wafer W placed on the pedestal 550 may be adsorbed to the electrostatic chuck 551 by the coulomb force and may maintain being adsorbed to the electrostatic chuck 551.

Next, the pedestal 550 is cooled to a temperature of about −100° C. or less by a chiller (540 of FIG. 2) (S820), plasma is generated from the gas supplied through the gas distribution unit 530, and the wafer W is etched (S830).

Figure 7:
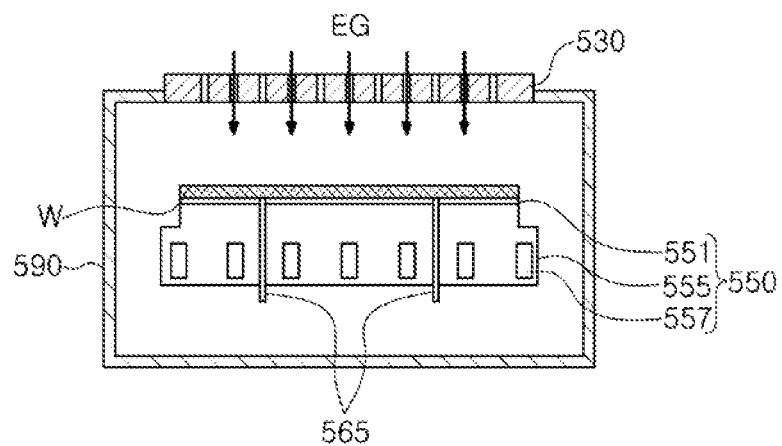

As illustrated in FIG. 7, a coolant is supplied from the chiller (540 of FIG. 3) and circulated through a coolant passage 557, and the pedestal 550 may be cooled to a desired temperature (for example, about −100° C. or less). At the same time, the wafer W on the pedestal 550 may also be cooled to the desired temperature (for example, about −100° C. or less). Gas EG for generating plasma is sprayed into the chamber 590 through the gas distribution unit 530, such that plasma may be generated from the supplied gas EG between the gas distribution unit 530 and the pedestal 550 by supplying the high frequency power into the chamber 590. The wafer W may be etched by the generated plasma at the desired low temperature (for example, about −100° C. or less). The gas EG for generating plasma may include the fluorine-containing gas. For example, the fluorine-containing gas may include at least one selected from, for example, $CF_4$, $C_4F_6$, $C_4F_8$, $CHF_3$ and $SF_6$. In particular, the gas may be $CF_4$, $SF_6$ or a combination thereof. However, the present inventive concept is not limited thereto. For example, in addition to the fluorine-containing gas, the gas EG for generating plasma may further include one or more selected from, for example, oxygen ($O_2$), hydrogen ($H_2$), nitrogen (N$_2$), chlorine (Cl$_2$), argon (Ar), helium (He), ammonia (NH$_3$), boron trichloride (BCl$_3$), and hydrogen bromide (HBr).

As described above, the plasma etching process at a low temperature may be used to form a fine semiconductor structure with a high aspect ratio, by not only ensuring a high selectivity ratio in wafer etching using photoresist as an etch mask, but also operating the etching gas simultaneously with the passivation gas.

Next, the etched wafer W is raised to be spaced apart from the pedestal 550 (S840).

Figure 8:
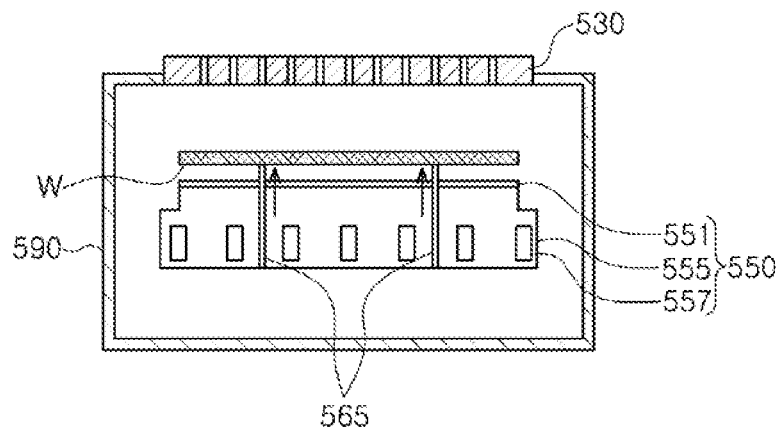

After the plasma etching process at the low temperature, a DC voltage opposite to that at the time of adsorption of the wafer W is applied to the electrostatic chuck 551 to discharge the charge of the wafer W, as illustrated in FIG. 8, and lifting the wafer W may be performed by using the lifting pin 565. The lifted wafer may be separated from the electrostatic chuck 551 which is at low temperature. Thus, a lower surface of the wafer W may be exposed. The inert gas IG, which is heated, injected into the chamber 590 may be directly in contact with the upper and lower surfaces of the wafer W, in the subsequent heating process using the inert gas IG. In this case, heating the lifted wafer W, which has a smaller mass, may be easier and more efficient than heating the wafer W on the pedestal 550, which has a larger mass. Accordingly, the cooled wafer W may be rapidly heated to room temperature from the low temperature.

Then, heated inert gas IG is injected into the chamber 590 through the gas distribution unit 530 (S850).

Figure 9:
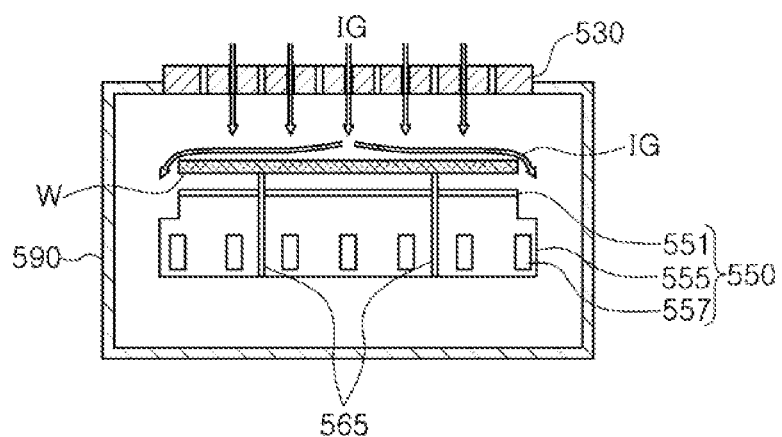

As illustrated in FIG. 9, the heated inert gas IG may be supplied to the chamber 590 through the gas distribution unit 530, and the cooled wafer W may be heated to a level of room temperature within the chamber 590 within a short period of time. The heated inert gas IG may have a temperature in a range from about 50° C. to about 100° C. For example, the inert gas IG may be at least one inert gas selected from, for example, He, Ne, Ar, Kr and Xe. The heated inert gas IG, heated in the heating process, is sprayed onto the wafer W through the gas distribution unit 530 and is directly in contact with the wafer W. For example, the heated inert gas IG may be in direct contact with the upper and lower surfaces of the wafer W. Therefore, the wafer W may be heated to a temperature in a range of about 10° C. to about 30° C. within a short time such as 10 seconds or more (for example, about 10 seconds to about 1 minute). Further, since the wafer W is heated over almost the entire surface, the entire area of the wafer W may be rapidly heated to a desired room temperature, and the uniform temperature rise may be expected. In addition, the heated inert gas IG may also be able to provide a clean environment without moisture and containments for the cooled wafer W besides having the capability of heating the cooled wafer W.

As described above, the temperature of the wafer W may be rapidly heated to a room temperature by the heated inert gas IG after the etching of the wafer W at the low temperature or the ultra-low temperature, and accordingly, the absorption of foreign substances and/or moisture on the surface of the wafer W due to the cold trap effect may be effectively prevented.

A uniform and rapid temperature rise may be ensured by bringing the heated inert gas IG into contact with the lower surface of the wafer W in addition to the upper surface by lifting the wafer W using the lifting pin 565. As described above, by solving the problem caused by the cold trap effect, the plasma etching process at the low or ultra-low temperature, which ensures a high etch selectivity ratio, may be stably performed.

Figure 10:
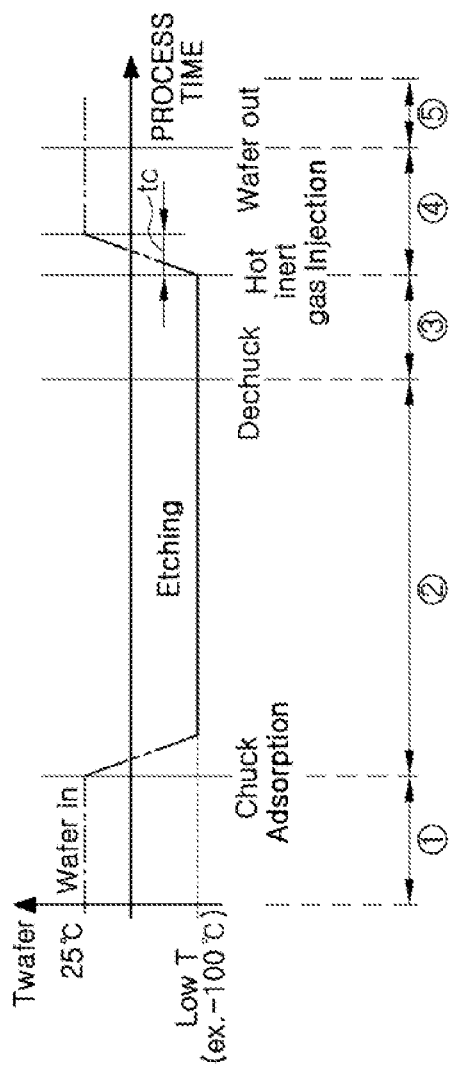
FIG. 10 is a graph illustrating a temperature of a wafer according to a process time (by key processes) in an etching method at a low temperature according to an example embodiment of the present inventive concept.

Referring to FIG. 10, the process of processing the wafers and the process of changing the temperature in processing the wafers may be explained in more detail. FIG. 10 is a graph illustrating the temperature of the wafer according to the process time (key process) in the etching method at the low temperature according to an example embodiment of the present inventive concept.

Referring to FIG. 10, the wafer is loaded into the chamber, disposed on the pedestal, and held by the electrostatic chuck (①). The loading process (①) may be performed at room temperature (for example, about 25° C.).

Next, while holding the wafer on the electrostatic chuck, the pedestal is cooled to a low temperature of about −100° C. by a chiller, and plasma is generated to perform the etching at the low temperature (②). The plasma etching process at the low temperature (②) may be performed at a low temperature (about −100° C. or less) for several minutes to several hours.

Next, as a dechucking process, the electrostatic force is released from the electrostatic chuck, and the wafer is lifted to be separated from the electrostatic chuck using the lifting pin (③). In the dechucking process (③), the plasma may be maintained in the chamber for a predetermined time (for example, about 1 minute to about 3 minutes) while the wafer is raised. In the present process (③), the temperature of the wafer may still be in a cooled state.

Next, the plasma may be discharged from the chamber and the heated inert gas may be injected into the chamber to heat the wafer to room temperature (for example, about 25° C.) (④). In the heating process (④), since the heated inert gas is injected in a state in which the wafer is raised, the wafer, including the front surface and the bottom surface of the wafer, may be entirely heated. As a result, the etched wafer at the low temperature may be uniformly heated over the entire area within a short time (for example, about 10 seconds to about 20 seconds) to reach room temperature (for example, about 25° C.) (④). In addition, by lifting the etched wafer, without the pedestal draining the heat from the lifted etched wafer, the lifted etched wafer may be quickly heated to room temperature (for example, about 25° C.) (④) by the heated inert gas. A step of injecting the heated inert gas may be performed after or while the pressure within the chamber is raised. The temperature of the wafer may be rapidly raised by activating the contact with the inert gas by increasing the pressure in the chamber.

When the temperature of the wafer reaches the target temperature (for example, room temperature, about 25° C.), after the step of etching the wafer, the gate (505 in FIG. 2 and FIG. 3) may be opened to carry out the wafer from the chamber (for example, into the transfer chamber) (⑤).

As described above, the temperature of the etched wafer at the low temperature (about −100° C. or less) may be rapidly heated to the room temperature (for example, about 25° C.) by the heated inert gas, and accordingly, the adsorption of foreign substance and/or moisture on the surface of the wafer due to the cold trap effect may be effectively prevented.

In addition, without additional facility, by using the gas distribution system and the lift assembly including the gas supply unit, which is the existing facility, efficient heating may be ensured without significantly delaying the overall time of the plasma etching process at the low temperature.

As set forth above, according to the example embodiments of the present inventive concept, a temperature of an etching object (in detail, a wafer) may be quickly heated to a room temperature by a heated inert gas after an etching at a low temperature or an ultra-low temperature, and as a result, moisture and/or foreign substances may be effectively prevented from being absorbed on a surface of a wafer or alleviating the generation of defects due to the cold trap effect.

Uniform and rapid temperature increase may be ensured by contacting a heated inert gas with an upper surface and a lower surface of a wafer by lifting the wafer using a lifting pin. In addition, by lifting the wafer, without the pedestal draining the heat from the wafer, the lifted wafer may be quickly heated to reach the desired temperature by the heated inert gas. As such, by solving a problem caused by the cold trap effect, the plasma etching process at a low temperature or an ultra low temperature which ensures a high selectivity may be stably performed.

While specific example embodiments have been shown and described above, it will be apparent to those skilled in the art that modifications and variations could be made without departing from the spirit and scope of the present inventive concept as defined by the appended claims.

What is claimed is:

1. A method of etching at a low temperature, the method comprising:
cooling a pedestal, on which a wafer is disposed, in a chamber;
etching the wafer by generating plasma from a gas supplied through a gas distribution unit; and
injecting a heated inert gas into the chamber through the gas distribution unit,
wherein the cooling of the pedestal comprises cooling the pedestal to a temperature of about −100° C. or less.

2. The method of claim 1, further comprising raising the wafer to be spaced apart from the pedestal, between the etching of the wafer and the injecting of the heated inert gas.

3. The method of claim 2, further comprising maintaining the plasma in the chamber for a predetermined time while the wafer is raised, before the injecting of the heated inert gas.

4. The method of claim 3, further comprising discharging the plasma from the chamber, between the maintaining of the plasma in the chamber and the injecting of the heated inert gas.

5. The method of claim 2, wherein the injecting of the heated inert gas is performed while the wafer is raised.

6. The method of claim 5, further comprising raising a pressure in the chamber after the etching of the wafer, wherein the injecting of the heated inert gas is performed at the raised pressure.

7. The method of claim 1, wherein the injecting of the heated inert gas is performed until the wafer reaches a temperature in a range of about 10° C. to about 30° C.

8. The method of claim 1, wherein the injecting of the heated inert gas is performed for about 10 seconds to about 1 minute.

9. The method of claim 1, wherein a temperature of the heated inert gas is in a range of about 50° C. to about 100° C.

10. The method of claim 1, wherein the heated inert gas is selected from at least one of He, Ne, Ar, Kr and Xe.

11. The method of claim 1, wherein the etching of the wafer comprises the generating of the plasma from a fluorine-containing gas, using high frequency power.

12. The method of claim 11, wherein the fluorine-containing gas is selected from one of $SF_6$, $CF_4$, and combinations thereof.

13. A method of etching at a low temperature, the method comprising:
disposing a wafer on a pedestal in a chamber;
cooling the pedestal to about −100° C. or lower using a chiller;
etching the wafer by generating plasma from a gas supplied from a gas distribution unit;
raising the etched wafer to be spaced apart from the pedestal; and
injecting a heated inert gas into the chamber through the gas distribution unit.

14. The method of claim 13, further comprising maintaining the plasma in the chamber for about 1 to about 3 minutes while the etched wafer is raised, before the injecting of the heated inert gas.

15. The method of claim 14, further comprising discharging the plasma from the chamber between the maintaining of the plasma in the chamber and the injecting of the heated inert gas.

16. The method of claim 13, wherein a temperature of the heated inert gas is in a range of about 50° C. to about 100° C., and the injecting of the heated inert gas is performed for about 10 seconds or more.

* * * * *